(12) United States Patent
Frischknecht

(10) Patent No.: US 7,372,069 B2
(45) Date of Patent: May 13, 2008

(54) INTERFACE FOR UV-CURABLE ADHESIVES

(75) Inventor: Kyle D. Frischknecht, Livermore, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/342,568

(22) Filed: Jan. 14, 2003

(65) Prior Publication Data

US 2004/0135268 A1    Jul. 15, 2004

(51) Int. Cl.
*H01L 29/08*   (2006.01)
*H01L 35/24*   (2006.01)
*H01L 51/00*   (2006.01)

(52) U.S. Cl. .................. 257/40; 257/E51.022
(58) Field of Classification Search ............... 257/788, 257/40, 642, 643, 759; 313/512
See application file for complete search history.

(56) References Cited

U.S. PATENT DOCUMENTS

| | | | |
|---|---|---|---|
| 4,963,196 A | 10/1990 | Hashimoto | |
| 5,457,565 A | 10/1995 | Namiki et al. | |
| 5,881,089 A | 3/1999 | Berggren et al. | |
| 5,909,081 A * | 6/1999 | Eida et al. | 313/504 |
| 6,268,695 B1 | 7/2001 | Affinito | |
| 6,483,099 B1 | 11/2002 | Yu et al. | |
| 6,485,884 B2 | 11/2002 | Wolk et al. | |
| 6,522,067 B1 | 2/2003 | Graff et al. | |
| 6,614,057 B2 * | 9/2003 | Silvernail et al. | 257/99 |
| 6,720,203 B2 | 4/2004 | Carcia et al. | |
| 6,724,143 B2 * | 4/2004 | Chen et al. | 313/512 |
| 6,803,245 B2 * | 10/2004 | Auch et al. | 438/26 |
| 2001/0028218 A1 * | 10/2001 | Mashiko et al. | 313/553 |
| 2002/0038997 A1 * | 4/2002 | Sakai et al. | 313/495 |

FOREIGN PATENT DOCUMENTS

JP   2-141235   *   5/1990

OTHER PUBLICATIONS

Merriam-Webster Online Dictionary, www.m-w.com/dictionary.*
Charles A. Harper, Electronic Packaging and Interconnection Handbook, 2000, McGraw-Hill, Third Edition, pp. 1.80 and 1.81.*
Charles A. Harper, Electronic Packaging and Interconnection Handbook, 2000, McGraw-Hill, Third Edition, p. 1.58.*

* cited by examiner

*Primary Examiner*—Monica Lewis
(74) *Attorney, Agent, or Firm*—Fish & Richardson P.C.

(57) ABSTRACT

In an embodiment of this invention, an adhesion layer is deposited on an encapsulation lid to provide strong adhesion with the UV-curable adhesive in order to improve encapsulation of an organic electronic device. The adhesion layer is comprised of a metallic layer or a ceramic layer that is thin enough to be nonopaque and thick enough to provide stronger adhesion at an interface with said UV-curable adhesive than said encapsulation lid.

11 Claims, 5 Drawing Sheets

Encapsulated Organic Electronic Device

INTERFACE FOR UV-CURABLE ADHESIVES

BACKGROUND OF THE INVENTION

An organic electronic device such as an organic light emitting diode ("OLED") (the OLED can be used in, for example, a display or as a light source element of a light source), an organic light sensor, an organic transistor, an organic solar cell, or an organic laser require protection from oxygen and moisture in the atmosphere, and therefore employ some form of encapsulation. One common procedure to encapsulate the organic electronic device is to sandwich it between a substrate and an encapsulation lid, and an adhesive around the perimeter of the device holds together the substrate and the encapsulation lid such that there is a continuous perimeter seal around the device.

OLEDs, in general, are known in the art and are discussed in, for example, U.S. Pat. No. 5,457,565 entitled "Organic Electroluminescent Device". Organic light sensors, in general, are also known in the art and are discussed in, for example, U.S. Pat. No. 6,483,099 entitled "Organic Diodes with Switchable Photosensitivity". Organic transistors, in general, are known in the art and are discussed in, for example, U.S. Pat. No. 6,485,884 entitled "Method for Patterning Oriented Materials for Organic Electronic Displays and Devices." Organic solar cells are also known in the art and are discussed in, for example, U.S. Pat. No. 4,963,196 entitled "Organic Solar Cell". Organic lasers are known in the art and are discussed in, for example, U.S. Pat. No. 5,881,089 entitled "Article Comprising an Organic Laser".

When manufacturing an organic electronic device, adhesives that provide low total accumulated cycle ("TAC") times and that remain stable or are workable over extended periods of time are desirable. Thermal-cure adhesives can be used to manufacture the organic electronic device but they have long TAC times (e.g., thermal-cure adhesives typically take an hour to cure) and is workable for only a short time (e.g., once the resin is mixed, the thermal-cure adhesive will typically cure after an hour or even less and the curing can occur anywhere, even in the dispensing equipment). On the other hand, UV-curable adhesives can cure very quickly when exposed to UV radiation (e.g., UV-curable adhesives have a low TAC time typically about ninety seconds), yet remain stable or workable for long periods until triggered by the UV radiation at a user-designated point in the process sequence. These characteristics, among others, make it desirable to use UV-curable adhesives to form the perimeter seal to encapsulate the organic electronic device.

In terms of degradation caused by the environment, the electronic device's lifetime is related to the permeation rate of oxygen and particularly water across this perimeter seal (the permeation rate through the substrates is generally negligible). This permeation rate is a sum of the permeation through the bulk of the sealing material ("bulk diffusion") and permeation along the interfaces between the sealing material and the substrate or encapsulation lid ("interface diffusion"). When the bonding to the encapsulation lid is weak (i.e., there's poor adhesion), permeation along this interface can be high, greatly shortening the device lifetime. Furthermore, poor adhesion can lead to delamination during mechanical processes such as scribe and break (i.e., device singulation). Therefore, strong adhesion to the encapsulation lid is important to effectively encapsulate the elements.

FIG. 1 shows a prior art encapsulated organic electronic device 106. In FIG. 1, an organic electronic device 115 is fabricated on a substrate 118. As stated earlier, the organic electronic device 115 can be an OLED, an organic light sensor, an organic transistor, an organic solar cell, or an organic laser. A UV-curable adhesive 112 is applied around the perimeter of the organic electronic device 115. An encapsulation lid 109 is placed on the UV-curable adhesive 112 in order to encapsulate the organic electronic device 115. The encapsulation lid 109 is nonopaque. The substrate 118 and the encapsulation lid 109 are moved together so that the UV-curable adhesive 112 is in contact with both the substrate 118 and the encapsulation lid 109. Then, UV radiation is applied to the UV-curable adhesive 112 in order to cure it (e.g., the adhesive absorbs the UV-radiation and transfers that energy to cross-link the adhesive groups so that the adhesive becomes rigid). One of the disadvantages of this configuration is that over time, delamination typically occurs at the interface between the UV-curable adhesive 112 and the encapsulation lid 109.

In order to decrease the likelihood of delamination and improve adhesion, an additional adhesion layer is typically incorporated. Incorporating the adhesion layer to improve encapsulation of the organic electronic device is not effective if UV-curable adhesive is also used since the materials that are good adhesion layers typically require a thickness that makes them opaque. FIG. 2 shows the prior art use of the adhesion layer extended to organic electronic device encapsulation. In FIG. 2, an organic electronic device 115 is fabricated on a substrate 118. An opaque adhesion layer 221 is deposited on the encapsulation lid 209. A UV-curable adhesive 112 is applied on the substrate 118 around the perimeter of the organic electronic device 115, or alternatively, applied on the opaque adhesion layer 221 such that when the encapsulation lid 209, the substrate 118, and the UV-curable adhesive 112 are brought together, the organic electronic device 115 is sealed around its perimeter. After the UV-curable adhesive is applied, the substrate 118 and the encapsulation lid 209 are moved together so that the UV-curable adhesive 112 is in contact with both the substrate 118 and the opaque adhesion layer 221 to seal the organic electronic device. Because this adhesion layer is opaque, UV radiation will not reach the UV-curable adhesive 112 to cure that adhesive. Therefore, one of the disadvantages of this configuration is that UV-curable adhesive cannot be used. A thermal-cure adhesive can be used, but this adhesive results in high TAC times and is workable for only a short time.

For the foregoing reasons, there exists a need to encapsulate the organic electronic device using a UV-curable adhesive such that there is strong adhesion at the interface between the UV-curable adhesive and the encapsulation lid.

SUMMARY

An embodiment of an encapsulated organic electronic device is described that has strong adhesion between the components that encapsulate the device. The embodiment of the encapsulated device includes a substrate, an organic electronic device on the substrate, and a UV-curable adhesive on the substrate where the UV-curable adhesive is applied such that it surrounds a perimeter of the organic electronic device. The encapsulated device also includes an adhesion layer on the UV-curable adhesive, and an encapsulation lid that is on the adhesion layer. The encapsulation lid is nonopaque, and the adhesion layer is made of a metallic layer or a ceramic layer that is thin enough to be nonopaque and thick enough to provide stronger adhesion at an interface with the UV-curable adhesive than the encapsulation lid.

An embodiment of a method to encapsulate an organic electronic device is described that provides strong adhesion between the components that encapsulate the device. The embodiment of this method includes fabricating the organic electronic device on a substrate, and depositing an adhesion layer on an encapsulation lid. The adhesion layer is made of a metallic layer or a ceramic layer that is thin enough to be nonopaque and thick enough to provide stronger adhesion than the encapsulation lid. The method further includes applying a UV-curable adhesive on the substrate or on the adhesion layer such that when the encapsulation lid, the substrate, and the UV-curable adhesive are brought together, the organic electronic device is sealed around its perimeter. The method also includes moving together the substrate and the encapsulation lid such that the UV-curable adhesive contacts the substrate and the adhesion layer to seal the organic electronic device around its perimeter. The method further includes applying UV radiation to the UV-curable adhesive to cure it.

Another embodiment of an encapsulated organic electronic device is described that has strong adhesion between the components that encapsulate the device. This other embodiment of the encapsulated device includes a substrate, an organic electronic device on the substrate, and a UV-curable adhesive that surrounds a perimeter of the organic electronic device. The encapsulated device also includes an adhesion layer on the UV-curable adhesive, and an encapsulation lid that is on the adhesion layer. The adhesion layer is made of chromium or titanium and is thin enough to be nonopaque and thick enough to provide stronger adhesion at an interface with the UV-curable adhesive than the encapsulation lid.

DETAILED DESCRIPTION

In an embodiment of this invention, an adhesion layer is deposited on an encapsulation lid to provide strong adhesion with the UV-curable adhesive in order to improve encapsulation of an organic electronic device. The adhesion layer is comprised of a metallic layer or a ceramic layer that is thin enough to be nonopaque and thick enough to provide stronger adhesion at an interface with said UV-curable adhesive than said encapsulation lid. As used within the specification and the claims, the term "on" includes when layers are in physical contact and when layers are separated by one or more intervening layers.

Figure 1:
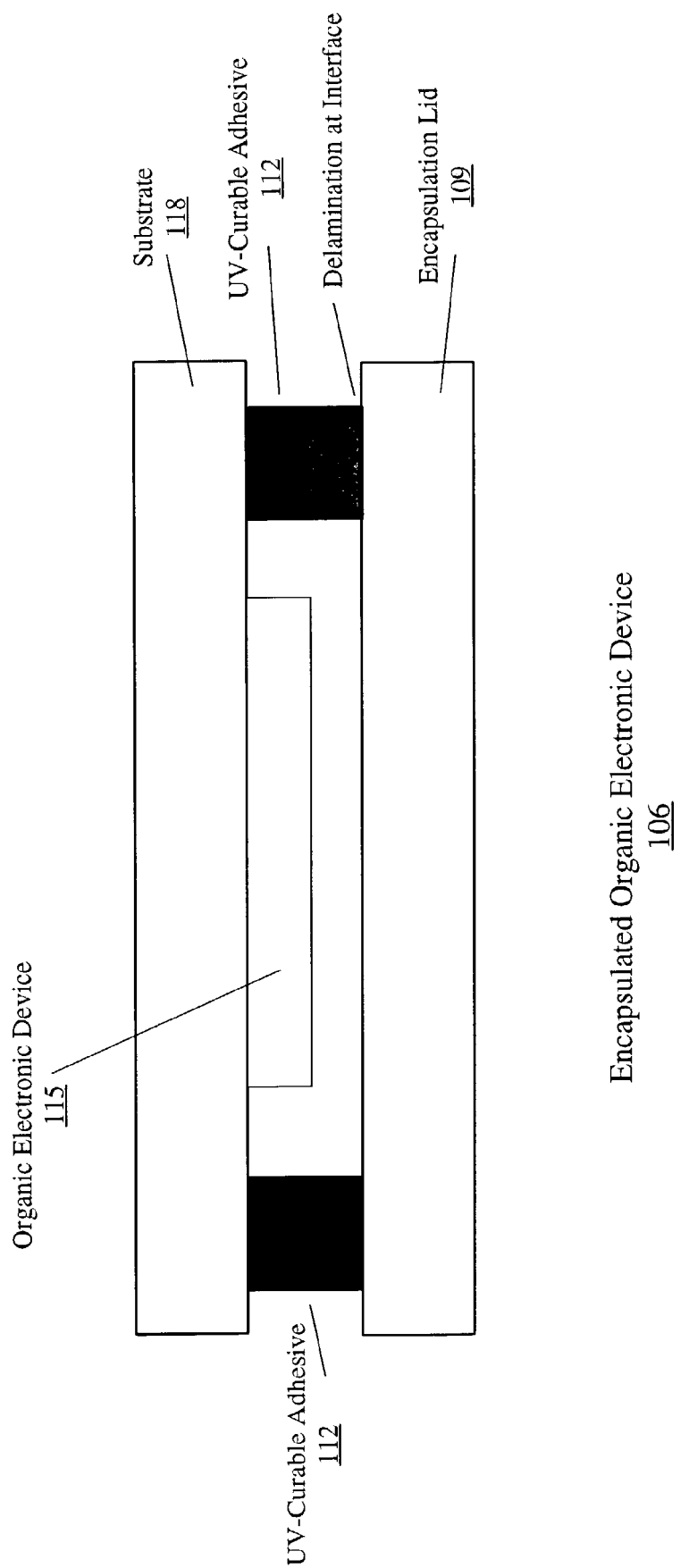
FIG. 1 shows a prior art encapsulated organic electronic device.
Figure 2:
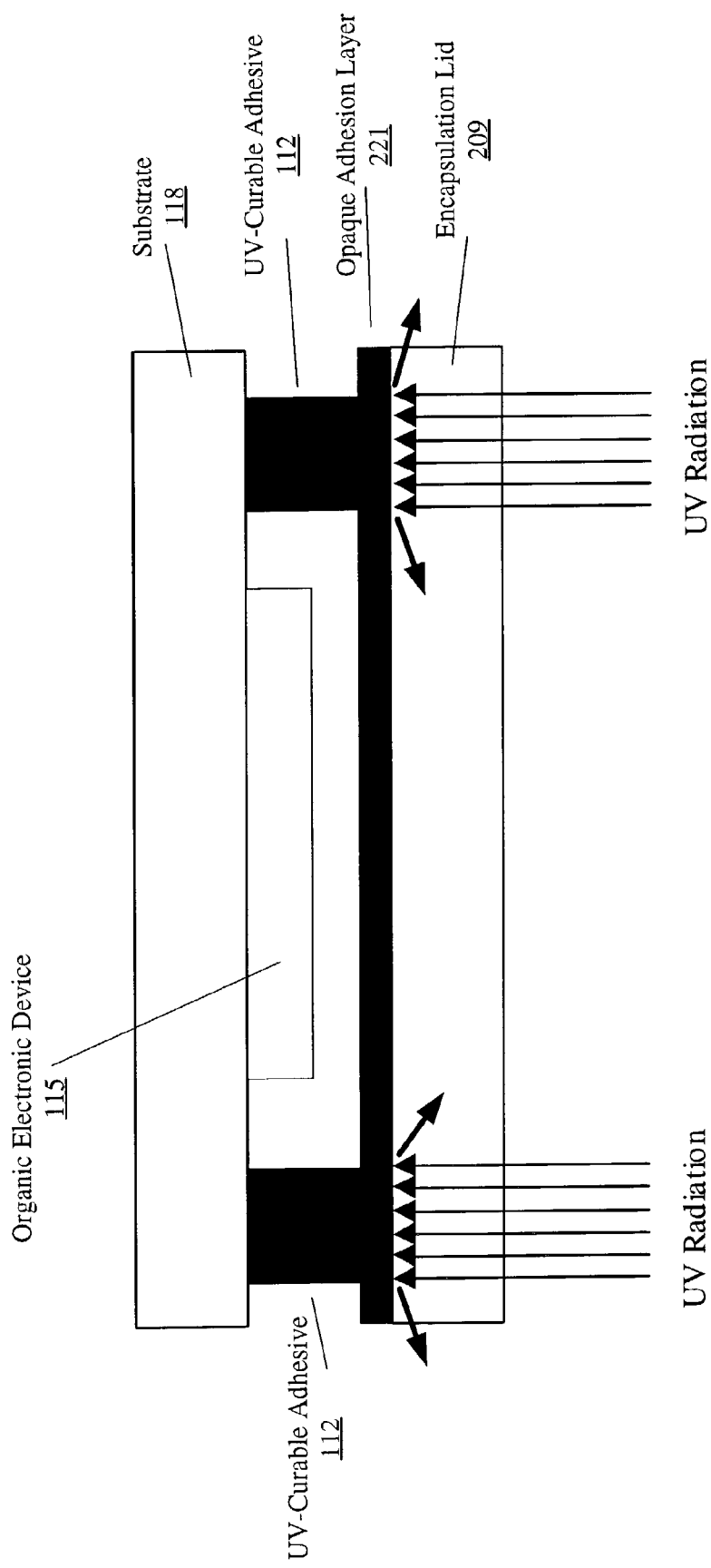
FIG. 2 shows the prior art use of the adhesion layer extended to organic electronic device encapsulation.
Figure 3:
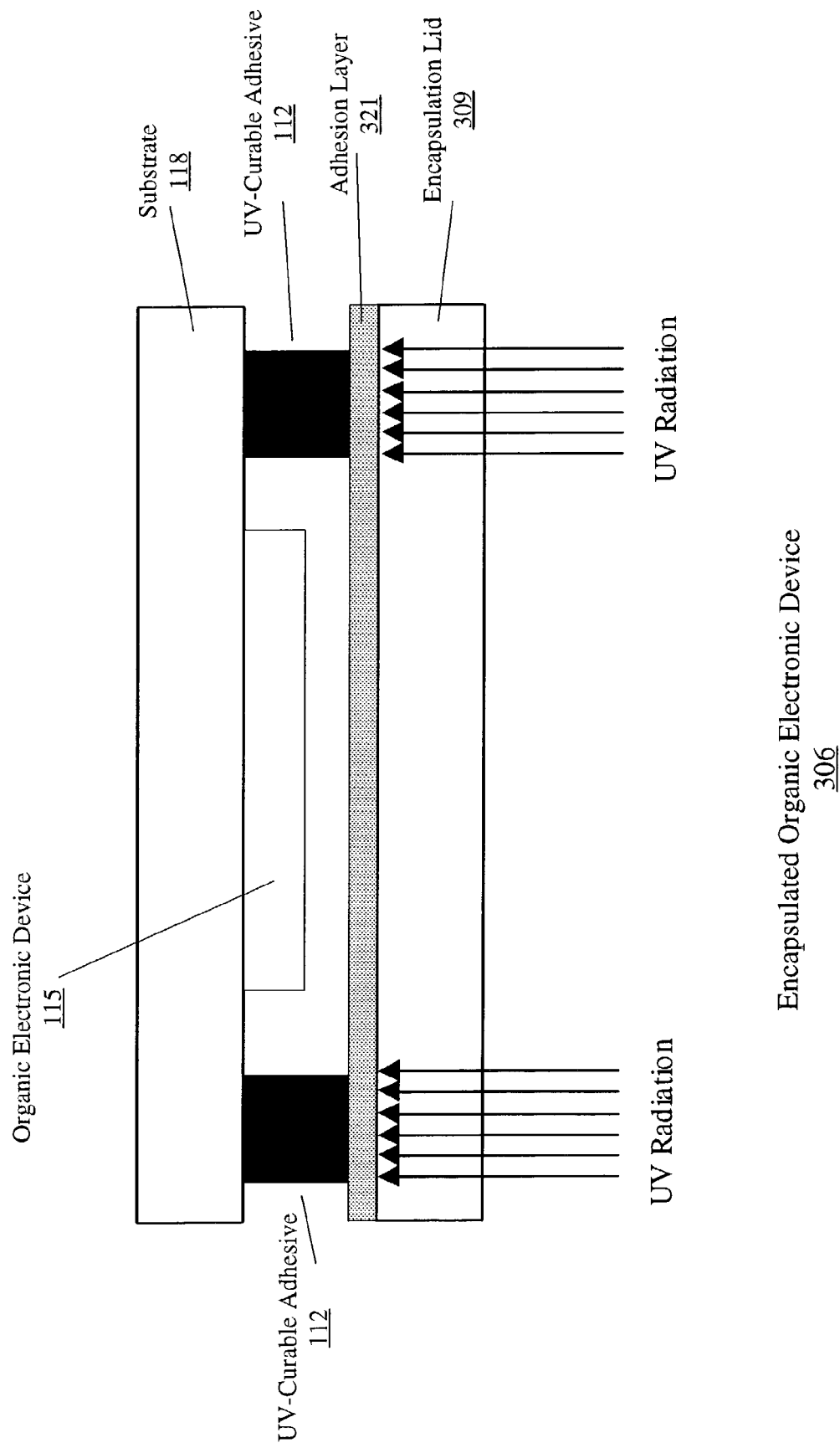
FIG. 3 shows an embodiment of an encapsulated organic electronic device according to the present invention.

FIG. 3 shows an embodiment of an encapsulated organic electronic device 306 according to the present invention. In FIG. 3, an organic electronic device 115 is fabricated on a substrate 118. An adhesion layer 321 is deposited on the encapsulation lid 309. The adhesion layer 321 is comprised of a metallic layer or a ceramic layer that is thin enough to be nonopaque to UV radiation and thick enough to provide stronger adhesion at the interface with the UV-curable adhesive 112 than the encapsulation lid 309. The adhesion layer 321 is comprised of, preferably, a metal or a metal alloy; more preferably, a transition metal or a transition metal alloy; most preferably, chromium, titanium, tantalum, tungsten, aluminum, nickel, vanadium, or an alloy thereof; and optimally, chromium. Alternatively, the adhesion layer 321 is comprised of ceramic and more specifically, an oxide, a carbide, a nitride, a boride, or a mixture thereof.

More specifically, with regards to the thickness of the adhesion layer 321, it is preferably thin enough such that the transparency (e.g., percentage of UV radiation passing through) of the adhesion layer 321 provides a reasonable TAC time.

In the optimum configuration in which the adhesion layer 321 is comprised of chromium, the optimum transparency of the chromium layer is approximately fifty percent and the optimum thickness of the chromium layer is approximately fifty angstroms. This configuration can increase the lifetime of the organic electronic device by a factor of two or more and also eliminate premature failures of the organic electronic device due to poor encapsulation.

The encapsulation lid 309 is comprised of a nonopaque material. Preferably, the nonopaque material is glass, or alternatively plastic with a barrier layer on the plastic. The barrier layer on the plastic prevents the moisture from contaminating the organic electronic device. This barrier layer is also nonopaque.

A UV-curable adhesive 112 is applied on the substrate 118 around the perimeter of the organic electronic device 115, or alternatively, the UV-curable adhesive 112 is applied on the adhesion layer 321 such that when the encapsulation lid 309, the substrate 118, and the UV-curable adhesive 112 are brought together, the organic electronic device 115 is sealed around its perimeter.

Because the adhesion layer 321 and the encapsulation lid 309 are nonopaque to UV radiation, UV radiation can pass through the layer and the lid to the UV-curable adhesive 112 in order to cure that adhesive. Because the UV-curable adhesive 112 is used to encapsulate the organic electronic device 115, the TAC time to cure the adhesive is reasonable. The reasonable TAC time to cure the adhesive is, for example, less than five minutes, preferably, about ninety seconds. Also, the UV-curable adhesive 112 remains stable or workable for long periods until some point in the process sequence where the user decides to apply UV radiation to cure the adhesive (i.e., the user designated point in the process sequence). Because the adhesion layer 321 provides better adhesion than either of the encapsulation lids 109, 309, the adhesion is stronger at the interface between the UV-curable adhesive 112 and the adhesion layer 321 resulting in a decreased likelihood of delamination.

Figure 4:
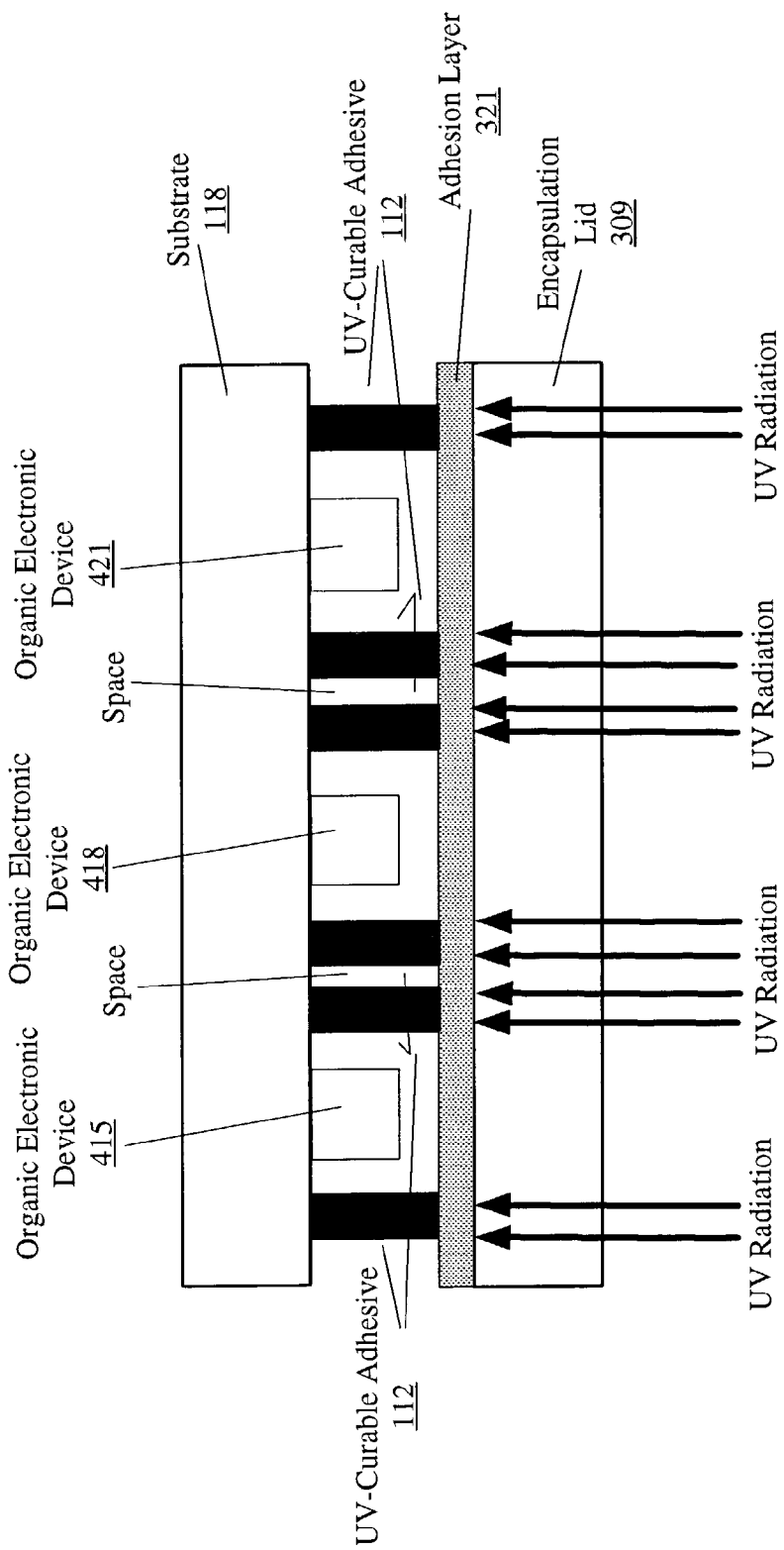
FIG. 4 shows an embodiment of multiple organic electronic devices that are encapsulated according to the present invention.

FIG. 4 shows an embodiment of multiple organic electronic devices that are encapsulated according to the present invention. In this embodiment, the UV-curable adhesive 112 is applied on the substrate 118 around the perimeter of each of the organic electronic devices 415, 418, 421, or alternatively, the UV-curable adhesive is applied on the adhesion layer 321 such that when the encapsulation lid 309, the substrate 118, and the UV-curable adhesive 112 are brought together, each of the organic electronic devices 415, 418, 421 is sealed around its perimeter. Further, the UV-curable adhesive is applied such that there is a space between the UV-curable adhesive encapsulating adjacent devices. The space allows each of the multiple organic electronic devices 415, 418, 421 to be singulated at the edges of the UV-curable adhesive without singulating at where the UV-curable adhesive resides; singulating at where the UV-curable adhesive resides can reduce the effectiveness of the encapsulation.

Because the adhesion layer 321 and the encapsulation lid 309 are nonopaque to UV radiation, UV radiation can pass through the layer and the lid to the UV-curable adhesive 112 in order to cure that adhesive.

Figure 5:
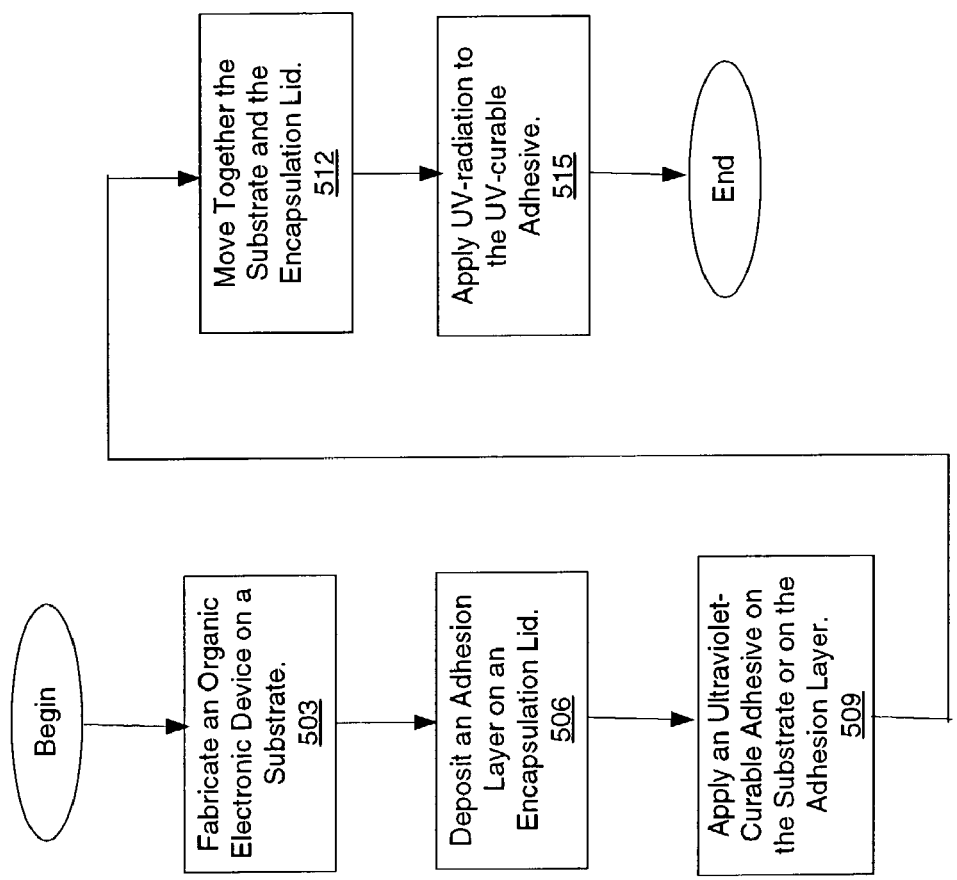
FIG. 5 shows an embodiment of a method to encapsulate an organic electronic device according to the present invention.

FIG. 5 shows an embodiment of a method to encapsulate an organic electronic device according to the present invention. In block 503, an organic electronic device is fabricated on a substrate. In block 506, an adhesion layer is deposited on an encapsulation lid. The adhesion layer includes a metallic layer or a ceramic layer that is thin enough to be nonopaque to UV radiation and thick enough to provide stronger adhesion at the interface with the UV-curable adhesive than the encapsulation lid 309. The adhesion layer is comprised of, preferably, a metal or a metal alloy; more preferably, a transition metal or a transition metal alloy; most preferably, chromium, titanium, tantalum, tungsten, aluminum, nickel, vanadium, or an alloy thereof; and optimally, chromium. Alternatively, the adhesion layer is comprised of ceramic and more specifically, an oxide, a carbide, a nitride, a boride, or a mixture thereof.

More specifically, with regards to the thickness of the adhesion layer, it is preferably thin enough such that the transparency (e.g., percentage of UV radiation passing through) of the adhesion layer provides a reasonable TAC time.

In block 509, a UV-curable adhesive is applied on the substrate along the perimeter of an organic electronic device, or alternatively, the UV-curable adhesive is applied on the adhesion layer such that when the encapsulation lid, the substrate, and the UV-curable adhesive are brought together, the organic electronic device is sealed around its perimeter.

In block 512, the substrate and the encapsulation lid are brought together such that the UV-curable adhesive contacts both the substrate and the adhesion layer so as to seal the organic electronic device. In block 515, UV radiation is applied to the UV-curable adhesive to cure it. Because the encapsulation lid and the adhesion layer are nonopaque to UV radiation, the UV radiation passes through these two items to reach the UV-curable adhesive and cures it.

EXAMPLE

An OLED was fabricated on a substrate. A chromium layer was deposited by sputter coating onto an encapsulation lid made of glass. The chromium layer had a thickness of approximately fifty angstroms and passed through approximately fifty percent of the UV radiation. The UV-curable adhesive was applied on the substrate along the perimeter of the OLED. The substrate and the encapsulation lid were brought together such that the UV-curable adhesive contacted both the substrate and the adhesion layer so as to seal the OLED. Use of the adhesion layer (i.e., the chromium layer), increased the lifetime of the OLED by a factor of two or more and also eliminated premature failures of the OLED.

As any person of ordinary skill in the art of organic electronic device fabrication will recognize from the description, figures, and examples that modifications and changes can be made to the embodiments of the invention without departing from the scope of the invention defined by the following claims.

What is claimed:

1. An encapsulated organic electronic device, comprising:
a substrate;
an organic electronic device on said substrate;
an ultraviolet ("UV")-curable adhesive on said substrate, said UV-curable adhesive surrounds a perimeter of said organic electronic device;
an adhesion layer on said UV-curable adhesive, wherein said adhesion layer is comprised of tantalum or vanadium and is nonopaque to UV radiation; and
an encapsulation lid directly on said adhesion layer, said encapsulation lid being nonopaque to UV radiation.

2. The encapsulated organic electronic device of claim 1 wherein said adhesion layer is comprised of an alloy of tantalum or an alloy of vanadium.

3. The encapsulated organic electronic device of claim 1 wherein said organic electronic device is an OLED, an organic transistor, an organic light sensor, an organic solar cell, or an organic laser.

4. A method to encapsulate an organic electronic device, comprising fabricating said encapsulated organic electronic device of claim 1.

5. The method of claim 4 wherein said adhesion layer is thin enough to provide a reasonable TAC time.

6. The method of claim 4 wherein said adhesion layer is comprised of an alloy of tantalum or an alloy of vanadium.

7. The method of claim 4 wherein said organic electronic device is an OLED, an organic transistor, an organic light sensor, an organic solar cell, or an organic laser.

8. The method of claim 4 wherein said encapsulation lid is comprised of glass, or plastic with a barrier layer on said plastic, wherein said barrier layer is nonopaque.

9. The encapsulated organic electronic device of claim 1, wherein said encapsulation lid is comprised of glass.

10. The encapsulated organic electronic device of claim 1, wherein the adhesion layer is directly on the UV-curable adhesive.

11. The encapsulated organic electronic device of claim 1, wherein the adhesion layer substantially covers one surface of the encapsulation lid.

* * * * *